(12) United States Patent
Peter et al.

(10) Patent No.: US 8,581,236 B2
(45) Date of Patent: Nov. 12, 2013

(54) ELECTRICALLY PUMPED OPTOELECTRONIC SEMICONDUCTOR CHIP

(75) Inventors: Matthias Peter, Regensburg (DE); Tobias Meyer, Ihrlerstein (DE); Jürgen Off, Regensburg (DE); Tetsuya Taki, Yokohama (JP); Joachim Hertkorn, Alteglofsheim (DE); Matthias Sabathil, Regensburg (DE); Ansgar Laubsch, Regensburg (DE); Andreas Biebersdorf, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 108 days.

(21) Appl. No.: 13/383,495

(22) PCT Filed: Jun. 30, 2010

(86) PCT No.: PCT/EP2010/059291
§ 371 (c)(1),
(2), (4) Date: Mar. 12, 2012

(87) PCT Pub. No.: WO2011/018273
PCT Pub. Date: Feb. 17, 2011

(65) Prior Publication Data
US 2012/0161103 A1    Jun. 28, 2012

(30) Foreign Application Priority Data

Aug. 13, 2009 (DE) .......................... 10 2009 037 416

(51) Int. Cl.
*H01L 29/06* (2006.01)
*H01L 21/00* (2006.01)

(52) U.S. Cl.
USPC .............................. 257/35; 438/61

(58) Field of Classification Search
USPC .................... 257/17, 35, E39.012–E39.015; 438/59–63
See application file for complete search history.

(56) References Cited

U.S. PATENT DOCUMENTS 5,023,685 A * 6/1991 Bethea et al. .................. 257/21
6,849,881 B1   2/2005 Harle et al.
(Continued)

FOREIGN PATENT DOCUMENTS

| EP | 1 667 292 A1 | 6/2006 |
|---|---|---|
| EP | 1 764 840 A1 | 3/2007 |
| EP | 1 883 141 A1 | 1/2008 |

OTHER PUBLICATIONS

S.J. Chang et al., "400-nm InGaN-GaN and InGaN-AlGaN Multiquantum Well Light-Emitting Diodes," IEEE Journal of Selected Topics in Quantum Electronics, vol. 8, No. 4, Jul./Aug. 2002, pp. 744-748.

(Continued)

*Primary Examiner* — Calvin Lee
(74) *Attorney, Agent, or Firm* — DLA Piper LLP (US)

(57) ABSTRACT

An electrically pumped optoelectronic semiconductor chip includes at least two radiation-active quantum wells comprising InGaN or consisting thereof. The optoelectronic semiconductor chip includes at least two cover layers which include AlGaN or consist thereof. Each of the cover layers is assigned to precisely one of the radiation-active quantum wells. The cover layers are each located on a p-side of the associated radiation-active quantum well. The distance between the radiation-active quantum well and the associated cover layer is at most 1.5 nm.

15 Claims, 2 Drawing Sheets

(56) References Cited

U.S. PATENT DOCUMENTS

| | | | |
|---|---|---|---|
| 7,786,508 B2 * | 8/2010 | Perera et al. | ................. 257/184 |
| 2002/0053676 A1 | 5/2002 | Kozaki | |
| 2002/0179923 A1 | 12/2002 | Morita et al. | |
| 2004/0135136 A1 | 7/2004 | Takahashi et al. | |
| 2006/0108603 A1 | 5/2006 | Uemura et al. | |
| 2006/0268953 A1 | 11/2006 | Ikedo et al. | |
| 2008/0054247 A1 | 3/2008 | Eichler et al. | |
| 2008/0217632 A1 | 9/2008 | Tomiya et al. | |
| 2008/0247435 A1 | 10/2008 | Choi | |
| 2009/0183774 A1 * | 7/2009 | Atanackovic | ................. 136/261 |

OTHER PUBLICATIONS

Aurélien David et al., "Carrier distribution in (0001)InGaN/GaN multiple quantum well light-emitting diodes," Applied Physics Letters, vol. 92, 2008, pp. 1-3.

* cited by examiner

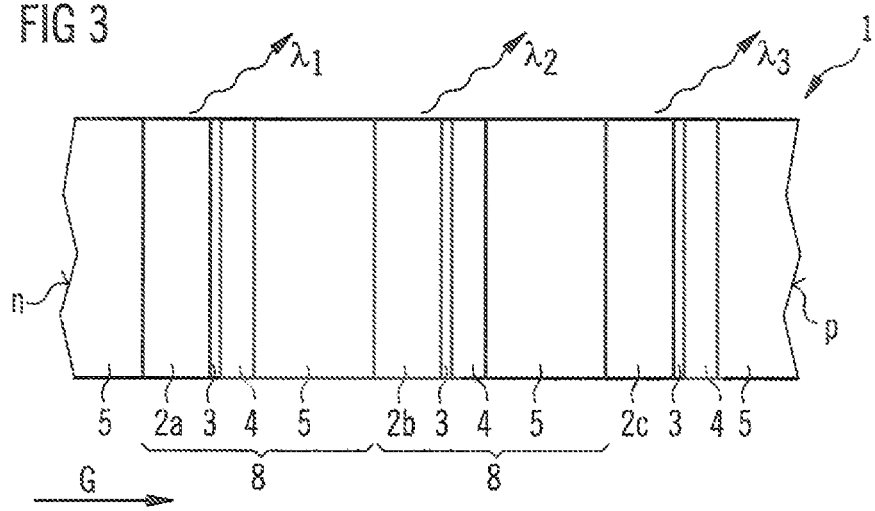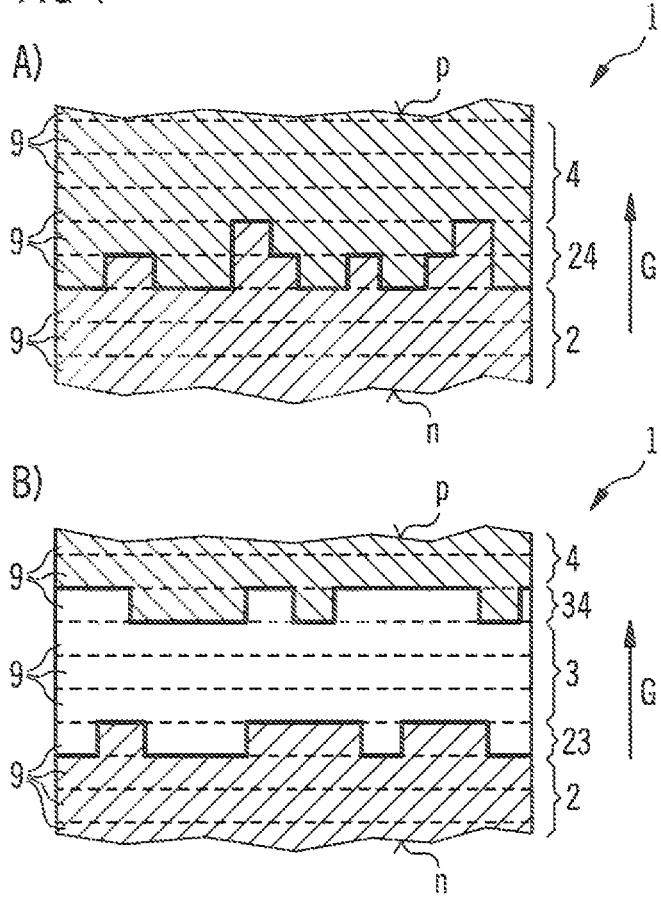

ELECTRICALLY PUMPED OPTOELECTRONIC SEMICONDUCTOR CHIP

RELATED APPLICATIONS

This is a §371 of International Application No. PCT/EP2010/059291, with an international filing date of Jun. 30, 2010 (WO 2011/018273, published Feb. 17, 2011), which is based on German Patent Application No. 10 2009 037 416.7, filed Aug. 13, 2009, the subject matter of which is incorporated by reference.

TECHNICAL FIELD

This disclosure relates to an electrically pumped optoelectronic semiconductor chip.

U.S. Pat. No. 6,849,881 B1 relates to an optoelectronic semiconductor component with a multi-quantum well structure.

US 2002/0179923 A1 provides a light-emitting diode.

It could nonetheless be helpful to provide an electrically pumped optoelectronic semiconductor chip which exhibits high efficiency at low current densities.

SUMMARY

We provide an electrically pumped optoelectronic semiconductor chip including at least two radiation-active quantum wells including InGaN or consisting thereof, and at least two cover layers including AlGaN or consisting thereof, wherein each of the cover layers is assigned to precisely one of the radiation-active quantum wells, the cover layers are each located on a p-side of the radiation-active quantum wells, and a distance between the radiation-active quantum wells and the associated cover layers is at most 1.5 nm.

We also provide an electrically pumped optoelectronic semiconductor chip including at least two radiation-active quantum wells including InGaN or consisting thereof, at least two cover layers including AlGaN or consisting thereof, and at least two interlayers including GaN or consisting thereof and wherein one of the interlayers is located in each case between one of the cover layers and the radiation-active quantum well associated with the cover layer, wherein each of the cover layers is assigned to precisely one of the radiation-active quantum wells, the cover layers are each located on a p-side of the radiation-active quantum wells, and a distance between the radiation-active quantum wells and the associated cover layers is at most 1.5 nm, the inter-layers have a thickness of 0.3 nm to 1.2 nm and Al content of the cover layers is 40% to 70%.

BRIEF DESCRIPTION OF THE DRAWINGS

FIGS. 1, 3 and 4 are schematic representations of examples of optoelectronic semiconductor chips described herein.

DETAILED DESCRIPTION

Figure 1:
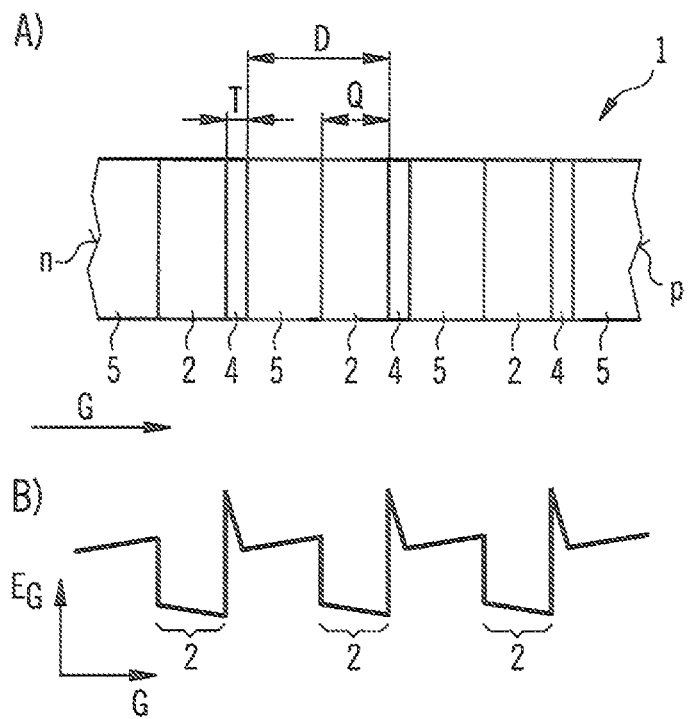

Our optoelectronic semiconductor chip may comprise at least two radiation-active quantum wells. "Radiation-active" means that when the semiconductor chip is in operation, electromagnetic radiation is generated in these quantum wells. For example, a proportion of the power generated of at least 2.5%, in particular of at least 4.0%, relative to the total radiation generated by the semiconductor chip, is generated in each of the radiation-active quantum wells. The wavelength of the radiation may be in the ultraviolet and/or visible spectral range, preferably at wavelengths of 420 nm to 480 nm.

The term "quantum well" does not here have any meaning with regard to quantization dimensionality. The term quantum wells thus covers, for example, multidimensional quantum wells, one-dimensional quantum wires, quantum dots, to be regarded as zero-dimensional, and any combination of these structures.

The optoelectronic semiconductor chip may be pumped electrically, i.e., positive or negative charge carriers are injected respectively on an electrical p-connection side and on an electrical n-connecting side of the semiconductor chip. These charge carriers may propagate in each case towards the other connecting side when the semiconductor chip is operated correctly. During this propagation through the semiconductor chip, at least some of the charge carriers arrive at the radiation-active quantum wells in which the positive charge carriers recombine at least in part with the negative charge carriers. The radiation emitted by the semiconductor chip is generated by this charge carrier recombination.

The radiation-active quantum wells may comprise InGaN or consist thereof.

The optoelectronic semiconductor chip may include at least two cover layers which comprise AlGaN or consist thereof. Each of the cover layers is preferably assigned to precisely one of the radiation-active quantum wells. In particular, the cover layers and the radiation-active quantum wells may be assigned to one another on a one-to-one basis.

Stating that the radiation-active quantum wells comprise InGaN and the cover layers AlGaN may mean that the quantum wells and the cover layers consist only of the stated atoms and contain an admixture of foreign atoms, for example, in the form of doping. The proportion of all the foreign atoms taken together in the radiation-active quantum wells and in the cover layers preferably amounts in each case to at most 1 atom %, in particular at most 0.1 atom %, preferably at most 0.01 atom %.

The cover layers may each be on a p-side of the radiation-active quantum wells. The fact that the cover layers are located on the p-side means that the cover layer is arranged upstream of the associated radiation-active quantum well in the main direction of propagation of positive charge carriers when the semiconductor chip is in operation. In other words, positive charge carriers, in particular "holes," pass first through the cover layer and then through the radiation-active quantum well associated with the cover layer when the semiconductor is operating properly.

The distance between the radiation-active quantum wells and the respectively associated cover layers may be at most 1.5 nm, in particular at most 1.0 nm, preferably at most 0.5 nm, i.e., the cover layers are in the immediate vicinity of the radiation-active quantum wells.

The electrically pumped optoelectronic semiconductor chip may comprise at least two radiation-active quantum wells, comprising InGaN or consisting thereof. Furthermore, the optoelectronic semiconductor chip includes at least two cover layers which comprise AlGaN or consist thereof. Each of the cover layers is assigned to precisely one of the radiation-active quantum wells. The cover layers are each located on a p-side of the associated radiation-active quantum wells. The distance between the radiation active quantum well and the associated cover layer amounts to at most 1.5 nm.

By using a plurality of quantum wells, an effective charge carrier density per radiation-active quantum well may be reduced when the semiconductor chip is in operation. The reduction of this charge carrier density may lead to an increase in internal and external quantum efficiency, calculated in each case on the basis of one of the radiation-active quantum wells. This is also accompanied by an increase in the brightness emitted by the semiconductor chip, and by a drop in a forward voltage.

If, as stated, cover layers of AlGaN are used and applied to the InGaN quantum wells, the structures of the conduction band and of the valence band of the semiconductor material are deformed due to boundary charge effects such as piezo fields. As a result of this deformation of the conduction band and of the valence band, negative charge carriers, in particular electrons, experience a higher barrier. In contrast, conduction of positive charge carriers, in particular of "holes," is promoted. The improved mobility of the positive charge carriers allows an effective increase in a wave function overlap of the wave functions of the positive and negative charge carriers in the radiation-active quantum wells.

The recombination rate of the positive and negative charge carriers may be increased by the increased wave function overlap. This may additionally lead to an improvement in small current behavior and high-temperature stability of the semiconductor chip, for example, at temperatures of above or around 120° C. In other words, light is emitted with a higher quantum yield at low current densities and elevated temperatures. In addition, greater mobility of the positive charge carriers may lead to more quantum wells being radiation-active and moreover to the possibility of the forward voltage being reduced due to the reduced charge carrier density per quantum well.

A further possible way of increasing the temperature stability of the semiconductor chip consists of forming fewer and comparatively thin quantum wells. However, this may be associated with a reduction in efficiency at room temperature.

The semiconductor chip may be produced by epitaxial growth.

The aluminium content of the cover layers may be 20% to 70%. In other words, 20% to 70% of the gallium lattice sites of GaN are occupied by aluminium atoms.

The cover layers may have a thickness or an average thickness of 0.2 nm to 1.5 nm, in particular 0.5 nm to 1.0 nm.

The optoelectronic semiconductor chip may comprise at least two interlayers. The interlayers consist of or comprise GaN. Stating that the interlayers comprise GaN may mean that foreign atoms are present in the interlayer in a concentration of less than 1 atom %, in particular of less than 0.1 atom %, preferably of less than 0.01 atom %.

One of the interlayers may be located in each case between one of the cover layers and radiation-active quantum well associated with the cover layer. The interlayer is in this case preferably in direct contact both with the radiation-active quantum well and with the associated cover layer.

The thickness of the interlayers may be in each case 0.3 nm to 1.2 nm, in particular 0.4 nm to 0.8 nm. If the interlayers are configured in such a way, the aluminium content of the cover layers preferably may be 40% to 70%.

A transition region between the radiation-active quantum wells, the cover layers and/or the interlayers may comprise a thickness of between one monolayer and three monolayers inclusive. A monolayer is here an individual, densely packer layer of atoms. The thickness of the monolayer thus corresponds to approximately the average atomic diameter of the atoms of the monolayer. In the case of GaN the thickness of the monolayer may be around 0.3 nm to 0.4 nm.

In the transition region the stoichiometric composition of one of the monolayers varies, for example, from the radiation-active quantum wells to a stoichiometric composition for instance of the cover layer. In other words, in the transition region, both InGaN and AlGaN are present in a locally delimited manner within a single monolayer. The monolayers in this case exhibit a main direction of extension which is perpendicular to a direction of growth of the semiconductor chip.

The distance between the radiation-active quantum wells and the respectively associated cover layers may be at most two monolayers. In other words, only at most two monolayers comprising a mixture of InGaN, GaN and/or AlGaN are present between a monolayer of the quantum well which, within the bounds of manufacturing tolerances, comprises in particular only InGaN, and between a monolayer of the cover layer which, within the bounds of manufacturing tolerances, comprises in particular only AlGaN. Hence, the aluminium content of the cover layer may preferably be 20% to 50%.

The optoelectronic semiconductor chip may comprise three radiation-active quantum wells to 20 radiation-active quantum wells, in particular five radiation-active quantum wells to 15 radiation-active quantum wells. It is in this case possible for the semiconductor chip to comprise a larger number of quantum wells, for example, more than 30 quantum wells, in which case just some of the quantum wells are radiation-active when the semiconductor chip is in operation. In other words, the semiconductor chip may then comprise both radiation-active quantum wells and radiation-inactive quantum wells.

The distance between two cover layers succeeding one another in the direction of growth may be 3 nm to 8 nm, in particular 4 nm to 6 nm.

A band gap of the radiation-active quantum wells may in each case be 2.55 eV to 3.0 eV. With a band gap of the radiation-active quantum wells within this range of values, an increase in the mobility of the positive charge carriers through the cover layer consisting of or comprising AlGaN is particularly efficient.

The average band gap of the interlayer may be increased by at least 20% relative to the average band gap of the associated radiation-active quantum well. In other words, the average band gap in the region of the interlayer may be at least 120%, in particular at least 130% of the band gap as averaged over the region of the associated radiation-active quantum well.

The average band gap in a region outside the radiation-active quantum well which directly adjoins the p-side of the quantum well is greater than in a corresponding region on the n-side of the radiation-active quantum well. The n-side in this case faces an n-connection side of the semiconductor chip. The regions outside the radiation-active quantum well on the p-side and on the n-side preferably have a width of 0.4 nm to 1.0 nm, in particular 0.6 nm. In addition, the average band gap of the region on the p-side preferably may be at least 105%, in particular at least 110% of the average band gap of the region on the n-side.

Two adjacent radiation-active quantum wells may exhibit differing average band gaps. In other words, the adjacent radiation-active quantum wells are designed to emit radiations with different wavelengths when the semiconductor chip is in operation.

The differences in average band gap between the adjacent quantum wells may be 0.03 eV to 0.20 eV, in particular 0.05 eV to 0.18 eV.

The optoelectronic semiconductor chip may comprise at least one barrier layer arranged between two adjacent radiation-active quantum wells. The barrier layer preferably comprises GaN or consists thereof.

In particular, the barrier layer directly adjoins one of the cover layers and one of the radiation-active quantum wells not associated with the cover layer.

An optoelectronic semiconductor chip described here will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1A is as a schematic sectional representation of an example of an electrically pumped semiconductor component 1. The semiconductor chip 1, which is preferably grown epitaxially, comprises a p-connection side p and an n-connection side n. When the semiconductor chip 1 is operating properly, a positive voltage is applied to the p-connection side p, and a voltage which is negative relative to the p-connection side p is applied to the re-connection side n. When the semiconductor chip 1 is in operation, negative charge carriers such as electrons move from the n-connection side n to the p-connection side p, while positive charge carriers such as holes move from the p connection side p to the n-connection side n. The charge carriers are in each case injected into the semiconductor chip 1 via the connection sides p, n.

The semiconductor chip 1 comprises a plurality of radiation-active quantum wells 2. When the semiconductor chip 1 is in operation, electromagnetic radiation is generated in the radiation-active quantum wells 2 by recombination of the charge carriers. In the direction of the p-connection side p, for example, therefore, in the direction of growth G, a cover layer 4 is arranged downstream of each of the radiation-active quantum wells 2. The cover layer 4 has a thickness T of 0.2 nm to 0.5 nm inclusive, preferably around 0.5 nm. The cover layer 4 substantially consists of AlGaN, wherein the cover layer 4 may comprise doping in the form of foreign atoms. The proportion of the foreign atoms in the cover layer 4 here preferably is at most 0.01 atom %.

The thickness Q of the radiation-active quantum wells 2 is, for example, 1.5 nm to 4.5 nm, in particular around 3.5 nm. The quantum wells 2 here consist of InGaN. The indium content preferably is 15% to 35%. In other words, a proportion of 15% to 35% of the gallium lattice sites are occupied by indium atoms.

In the direction of growth G, there is a barrier layer 5 between each of the cover layers 4 and the radiation-active quantum wells 2. The barrier layer 5 preferably consists of GaN. The barrier layers 5 may also comprise doping with foreign atoms.

The distance between two adjacent cover layers 4 is preferably between 3 nm and 8 nm inclusive, in particular around 6 nm. In the example according to FIG. 1A, the aluminium content of the cover layers 4 is, for example, 20% to 50%.

FIG. 1B is a schematic illustration of the profile of a band gap $E_G$ in the direction of growth G. In the region of the radiation-active quantum wells 2 the band gap $E_G$ amounts, for example, to around 2.55 eV. In the region of the cover layers 4 the band gap $E_G$ preferably exceeds around 3.4 eV. As a result of the cover layers 4, a local increase thus takes place in the band gap $E_G$ and a type of distortion of the structure of the valence band and of the conduction band on p-sides of the radiation-active quantum wells 2 facing the p-connection side p. The band gap $E_G$ outside the radiation-active quantum wells 2 on the p-sides exceeds the band gap $E_G$ outside the radiation-active quantum wells 2 on n-sides which face the n-connection side n. This deformation of the band gap structure increases hole mobility.

This ensures that in particular all radiation-active quantum wells 2 contribute to the emission of radiation. The one of the quantum wells 2 which is located closest to the p-connection side p emits proportionally the most radiation, while the quantum well 2 which is located closest to the n-connection side n emits proportionally the least radiation. Each of the radiation-active quantum wells 2 preferably emits at least 2.5% of the total radiation output generated by the semiconductor chip 1.

Figure 2:
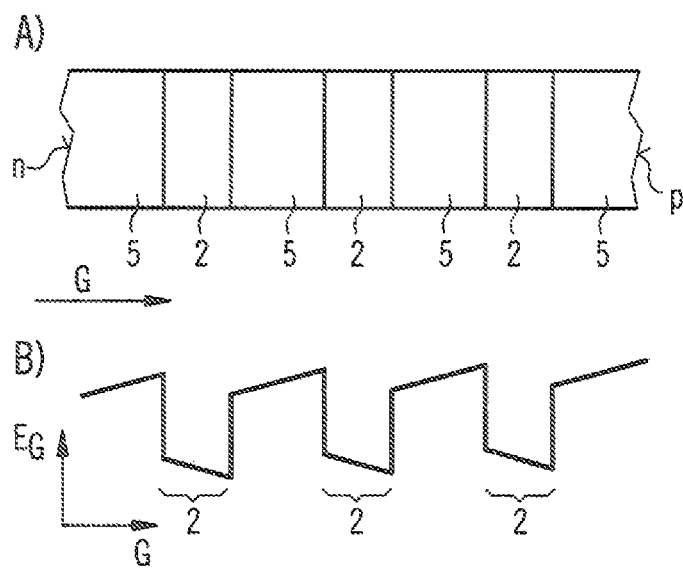
FIG. 2 is a schematic representation of a conventional semiconductor chip.

FIG. 2 shows a conventional optoelectronic semiconductor component, see the sectional representation in FIG. 2A and the band gap structure in FIG. 2B. Viewed in the direction of growth G, the semiconductor component exhibits a sequence of barrier layers 5 and quantum wells 2. Since the cover layers 4 are in particular absent from the semiconductor component according to FIG. 2, it is possible for just one of the quantum wells 2 to contribute to the emission of radiation.

The structure of the band gap $E_G$ manner does not exhibit any increase in the band gap on the p-sides of the quantum wells 2. On the contrary, the band gap $E_G$ is even reduced on the p-sides relative to the n-sides of the quantum wells 2.

In the example of the semiconductor chip 1 according to FIG. 3, there is an interlayer 3 between each of the radiation-active quantum wells 2a-c and the respectively associated cover layers 4. The interlayer 3 consists of GaN and may, like the quantum wells 2, the cover layers 4 and the barrier layers 5, comprise doping of foreign atoms. The thickness of the interlayer 3 is preferably less than 1 nm. In particular the thickness amounts to around 0.5 nm. In the semiconductor chip 1 according to FIG. 3, the aluminium content of the cover layers 4 is preferably between 40% and 70% inclusive.

The semiconductor chip 1 preferably comprises between three layer sequences 8 and 20 layer sequences 8 inclusive. The layer sequences 8 in each case directly adjoin one another, without further interlayers. Each of the layer sequences 8 consists of one of the radiation-active quantum wells 2a-c, one of the interlayers 3, one of the cover layers 4 and one of the barrier layers 5. The stated layers succeed one another directly in the stated sequence, without further interlayers being present.

As in all the other examples, it is possible for the radiation-active quantum wells 2a-c each to generate radiation of different wavelengths $\lambda_1, \lambda_2, \lambda_3$ when the semiconductor chip 1 is in operation. The wavelength $\lambda_1$ is preferably around 440 nm, the wavelength $\lambda_2$ around 450 nm and the wavelength $\lambda_3$ around 465 nm. Wavelength should here in each case be taken to mean that wavelength at which a maximum spectral power density is emitted when the semiconductor chip 1 is in operation.

FIG. 4A is a schematic sectional representation of a further example of the semiconductor chip 1, which may, for example, be constructed in a manner similar to FIG. 1. FIG. 4B shows a detail view of the semiconductor chip 1 in particular similar to that shown in FIG. 3.

The semiconductor chips 1 comprise a sequence of monolayers 9 in the direction of growth G. The monolayers 9 extend in a direction perpendicular to the direction of growth G and each have a thickness amounting to the average atomic diameter of the atoms located in the respective monolayers 9. In FIGS. 4A and 4B the monolayers 9 are symbolized by regions of the semiconductor chip 1 which are delimited from one another by broken lines.

Between the radiation-active quantum well 2 and the cover layer 4 there is located a transition region 24, see FIG. 4A. In the transition region 24 there are sub-regions in which the material composition corresponds to that of the radiation-active quantum well 2. There are also other sub-regions in which the material composition corresponds to that of the cover layer 4. According to FIG. 4A the thickness of the transition region 24 amounts to two monolayers.

In the example according to FIG. 4B the transition regions 23, 24 between the radiation-active quantum well 2 and the interlayer 3 and between the radiation-active quantum well 2 and the cover layer 4 are each a single monolayer thick. Unlike in FIGS. 4A and 4B, the transition regions 23, 24, 34 may exhibit a preferred thickness of between one monolayer and three monolayers inclusive. The thickness of the transition regions 23, 24, 34 may be measured, for example, by transmission electron microscopy, TEM for short.

As also with all the examples, it is possible for the semiconductor chip 1 to comprise one or more further layers not shown in the figures. Such layers may be tunnel layers or tunnel junctions, charge carrier barrier layers, radiation-inactive quantum wells, electrical contact layers, cladding layers and/or optical waveguide layers. The radiation-active quantum wells 2 may likewise each have a varying indium content in the direction of growth G. It is therefore possible for the radiation-active quantum wells 2 to comprise a plurality of sublayers which are not shown and which differ from one another in indium content.

The number of radiation-active quantum wells 2 may, for example, be detected by determining the wavelength shift of the radiation emitted by the semiconductor chip 1 relative to the current intensity supplied to the semiconductor chip 1. The greater the wavelength shift, the smaller the number of radiation-active quantum wells. The number of radiation-active quantum wells may likewise be determined by determining the internal quantum efficiency of the radiation-active quantum wells relative to the current intensity with which the semiconductor chip 1 is operated.

The chips described herein are not restricted by the description given with reference to the examples. Rather, this disclosure encompasses any novel feature and any combination of features, including in particular any combination of features in the appended claims, even if the feature or combination is not itself explicitly indicated in the claims or examples.

The invention claimed is:

1. An electrically pumped optoelectronic semiconductor chip comprising:
   at least two radiation-active quantum wells comprising InGaN or consisting thereof, and
   at least two cover layers comprising AlGaN or consisting thereof,
   wherein
   each of the cover layers is assigned to precisely one of the radiation-active quantum wells,
   the cover layers are each located on a p-side of the radiation-active quantum wells, and
   a distance between the radiation-active quantum wells and the associated cover layers is at most 1.5 nm.

2. The optoelectronic semiconductor chip according to claim 1, in which a layer sequence is repeated three to twenty times,
   wherein
   adjacent layer sequences succeed one another directly, and
   the layer sequence consists of layers succeeding one another directly in the order listed:
   the radiation-active quantum well,
   an interlayer with or of GaN,
   the cover layer and
   a barrier layer which comprises GaN or consists thereof, and
in addition, the thickness of the cover layers is 0.5 nm to 1.0 nm and the interlayers have a thickness of 0.4 nm to 0.8 nm and the distance between two cover layers succeeding one another in the direction of growth is 4 nm to 6 nm.

3. The optoelectronic semiconductor chip according to claim 1, wherein Al content of the cover layers is 20% to 70%.

4. The optoelectronic semiconductor chip according to claim 1, wherein thickness or average thickness of the cover layers is 0.3 nm to 1.5 nm.

5. The optoelectronic semiconductor chip according to claim 1, which comprises at least two interlayers comprising GaN or consisting thereof and which are respectively located between the cover layers and the in each case associated radiation-active quantum wells.

6. The optoelectronic semiconductor chip according to claim 5, wherein the interlayers have a thickness of 0.3 nm to 1.2 nm and the Al content of the cover layers is 40% to 70%.

7. The optoelectronic semiconductor chip according to claim 5, wherein a transition region between the radiation-active quantum wells and the interlayers has a thickness of one to three monolayers.

8. The optoelectronic semiconductor chip according to claim 5, wherein the average band gap of the interlayers in each case is at least 120% of the average band gap of an associated radiation-active quantum wells.

9. The optoelectronic semiconductor chip according to claim 1, further comprising a transition region between the radiation-active quantum wells and the cover layers and has a thickness of one to three monolayers.

10. The optoelectronic semiconductor chip according to claim 1, wherein distance between the radiation-active quantum wells and the in each case associated cover layers is at most two monolayers and in which the Al content of the cover layers is 20% to 50%.

11. The optoelectronic semiconductor chip according to claim 1, which comprises 3 to 20 radiation-active quantum wells.

12. The optoelectronic semiconductor chip according to claim 1, wherein distance between two cover layers succeeding one another in the direction of growth is 3 nm to 8 nm.

13. An optoelectronic semiconductor chip according to claim 1, wherein a band gap of the radiation-active quantum wells is 2.55 eV to 3.0 eV.

14. The optoelectronic semiconductor chip according to claim 1, wherein at least two adjacent radiation-active quantum wells exhibit different average band gaps and the difference is 0.03 eV to 0.20 eV.

15. An electrically pumped optoelectronic semiconductor chip comprising:
   at least two radiation-active quantum wells comprising InGaN or consisting thereof,
   at least two cover layers comprising AlGaN or consisting thereof, and
   at least two interlayers comprising GaN or consisting thereof and wherein one of said interlayers is located in each case between one of the cover layers and the radiation-active quantum well associated with said cover layer,
   wherein
   each of the cover layers is assigned to precisely one of the radiation-active quantum wells,
   the cover layers are each located on a p-side of the radiation-active quantum wells, and
   a distance between the radiation-active quantum wells and the associated cover layers is at most 1.5 nm, the interlayers have a thickness of 0.3 nm to 1.2 nm and Al content of the cover layers is 40% to 70%.

* * * * *